United States Patent
Cote et al.

(10) Patent No.: US 8,255,840 B2
(45) Date of Patent: *Aug. 28, 2012

(54) SILICON TOLERANCE SPECIFICATION USING SHAPES AS DESIGN INTENT MARKERS

(75) Inventors: Michel Cote, San Jose, CA (US);
Michael Rieger, Portland, OR (US);
Philippe Hurat, San Jose, CA (US);
Robert Lugg, Hillsboro, OR (US); Jeff Mayhew, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 522 days.

This patent is subject to a terminal disclaimer.

(21) Appl. No.: 12/263,451

(22) Filed: Oct. 31, 2008

(65) Prior Publication Data
US 2009/0055788 A1 Feb. 26, 2009

Related U.S. Application Data

(63) Continuation of application No. 10/977,556, filed on Oct. 29, 2004, now Pat. No. 7,458,045.

(51) Int. Cl.
*G06F 17/50* (2006.01)
(52) U.S. Cl. .............................. 716/51; 716/52; 716/113
(58) Field of Classification Search .................... 716/51, 716/55, 112, 113, 119, 103, 52
See application file for complete search history.

(56) References Cited

U.S. PATENT DOCUMENTS

| | | | |
|---|---|---|---|
| 6,011,911 A | 1/2000 | Ho et al. | |
| 6,289,412 B1 | 9/2001 | Yuan et al. | |
| 6,366,874 B1 | 4/2002 | Lee et al. | |
| 6,522,007 B2 | 2/2003 | Kouno et al. | |
| 6,817,003 B2 | 11/2004 | Lippincott et al. | |
| 7,089,511 B2 | 8/2006 | Allen et al. | |
| 7,243,323 B2 * | 7/2007 | Williams et al. | 716/113 |
| 7,458,045 B2 * | 11/2008 | Cote et al. | 716/103 |
| 2003/0014725 A1 | 1/2003 | Sato et al. | |
| 2005/0229130 A1 * | 10/2005 | Wu et al. | 716/8 |
| 2006/0036977 A1 * | 2/2006 | Cohn et al. | 716/4 |

OTHER PUBLICATIONS

Entire Prosecution History of U.S. Appl. No. 10/977,556 by Michel Cote filed on Oct. 29, 2004.
A. Steffora, "The New IC Implementation Flow" Published in the Jul. 2002 edition of EDAVision, pp. 1-2.
R. Wilson, "Kahng calls for EDA, desing, mask shops to talk", Published Jun. 24, 2003, Silicon Strategies, pp. 1.

(Continued)

*Primary Examiner* — Vuthe Siek
(74) *Attorney, Agent, or Firm* — Fenwick & West LLP

(57) ABSTRACT

Design-specific attributes of a circuit (such as timing, power, electro-migration, and signal integrity) are used to automatically identify one or more regions of one or more layers in a layout of the circuit. The automatically identified regions may be provided to a manufacturing tool in GDSII by use of overlapping shapes in, or alternatively by moving existing shapes to, a different layer/datatype pair. For example, information about the automatically identified regions may be stored using a conventional datatype (e.g. value 0) with a new layer, or alternatively using a conventional layer (e.g. metal 3) with a new datatype (e.g. value 1), depending on the embodiment. The automatically identified regions contain cells and/or features (e.g. groups of shapes and/or individual shapes) whose tolerance in silicon (to be fabricated) is automatically changed from default, based on the design-specific attribute (s) and sensitivity thereto, expressed as design intent by a circuit designer.

20 Claims, 8 Drawing Sheets

OTHER PUBLICATIONS

P. Gupta, "A Cost-Driven Lithographic Correction Methodology Based on Off-the-Shelf Sizing Tools", DAC 2003, Jun. 2-3, 2003, pp. 1-6.
A. Hand, "Keep it (Relatively) Simple, Keep it (Relatively) Cheap", Semiconductor International, Sep. 1, 2004, pp. 1-2.
R. Wilson, "Researchers float design-for-manufacturing strategy", EETimes, Nov. 13, 2003, pp. 1-2.
R. Wilson, "Urgent call made for process tie-in", EEdesign, Jun. 30, 2003, pp. 1-2.
Dr. D. Rittman, Abstract "Design for Manufacturibity, The impact on the Physical Design Stage and Flow", Jun. 2004, pp. 1-19.
S. Raghvendra, Article printed from Electronic Engineering Times, Posted Sep. 16, 2003, pp. 1-3.
R. Goering, "SEMI's Oasis provides respite from GDSII", Silicon Strategies, Oct. 1, 2002, pp. 1-2.
R. Goering, OpenAccess API could link design, manufacturing, EETimes, Sep. 30, 2002, pp. 1-3.
Office Action dated Nov. 28, 2006 in U.S. Appl. No. 10/977,556, pp. 9.
Amendment dated Feb. 28, 2007 in U.S. Appl. No. 10/977,556, pp. 14.
Final Office Action dated May 1, 2007 in U.S. Appl. No. 10/977,556, pp. 7.
Amendment dated Sep. 4, 2007 in U.S. Appl. No. 10/977,556, pp. 10.
Examiner's Interview Summary Record dated Sep. 13, 2007 in U.S. Appl. No. 10/977,556, pp. 2.
Office Action dated Nov. 6, 2007 in U.S. Appl. No. 10/977,556, pp. 7.
Amendment dated Mar. 6, 2008 in U.S. Appl. No. 10/977,556, pp. 13.
Final Office Action dated May 22, 2008 in U.S. Appl. 10/977,556, pp. 8.
Amendment dated Aug. 22, 2008 in U.S. Appl. No. 10/977,556, pp. 16.
Notice of Allowance dated Sep. 15, 2008 in U.S. Appl. No. 10/977,556, pp. 4.

* cited by examiner

TIMING CRITICAL REGIONS
METAL 2 DATATYPE 1

TIMING CRITICAL REGIONS
METAL 3 DATATYPE 1

SILICON TOLERANCE SPECIFICATION USING SHAPES AS DESIGN INTENT MARKERS

CROSS-REFERENCE TO PARENT APPLICATION

This application is a continuation application of U.S. patent application Ser. No. 10/977,556 filed on Oct. 29, 2004 now U.S. Pat. No. 7,458,045 by Michel Cote et al. U.S. patent application Ser. No. 10/977,556 is incorporated by reference herein in its entirety.

BACKGROUND

1. Field of the Invention

The invention relates to design of semiconductor chips. More specifically, the invention relates to a method and an apparatus for using the effect of shapes on design-specific attributes to indirectly specify tolerances to be applied in manufacturing semiconductor devices via design intent.

2. Related Art

Traditionally, design data provided to manufacturing to specify the silicon structures comprising an integrated circuit, e.g. in the form of GDSII, contained geometrical information describing a single specific rendering of the silicon layout. Yield was achieved by producing parts very close to the specified geometries. Such a traditional process doesn't account for the fact that most features in any layout are not timing critical, and for such features a certain level of process variation may be tolerable. Less-aggressive optical proximity correction (OPC) for such non-critical features can lower costs. However, traditional manufacturing tools (such as mask synthesis, mask writer, mask inspection, wafer inspection and mask data preparation tools) are not aware of which shapes are critical and which are non-critical.

An article entitled "The New IC Implementation Flow" by Ann Steffora published in the July 2002 edition of EDAVision is incorporated by reference herein in its entirety. This article quotes Graham Bell, director of marketing for Nassda Corp as stating "The RTL to GDSII flow really means that when you are at the RTL stage, you have a sense of what your GDSII is," On the other hand, with design intent with the RTL to GDSII flow, the whole emphasis is on physical implementation, and that doesn't address the functional verification. "GDSII is not a handoff point anymore. Now we have to worry about manufacturing, OPC effects, implying that blurring that brick wall and it is the RTL to foundry/silicon flow," Bell concluded.

Another article entitled "Kahng calls for EDA, design, mask shops to talk" by Ron Wilson published Jun. 24, 2003 in Silicon Strategies is also incorporated by reference herein in its entirety. Kahng is described as calling for a "bidirectional design-manufacturing data pipe" to convey data back and forth between chip design teams, mask makers and foundries. This pipe would pass design intent forward to mask makers, so that, for example, they could apply resolution-enhancement technologies only where they would improve post-test yield of dice. In the reverse direction, Kahng's pipe would pass mask and process limitations back to design teams, so they wouldn't for instance insert mask correction features that couldn't be implemented or verified. Kahng provides four examples, which are discussed next.

A first example shares data between process and design teams, so that the impact of area fill and slotting on routing and on electrical parameters could be sharply reduced. In a second example, if the tool that inserted OPC was aware of the actual timing requirements of the nets on which it was working, the amount of OPC features inserted could be dramatically reduced, with a very significant impact on mask cost. This required passing netlist and timing data to the mask shop. In a third example, a small amount of information about the mask writing equipment could greatly enhance the mask data preparation step. In a fourth example, Kahng describes an ideal world, in which analog designers have accurate models of the data preparation, resolution enhancement and lithography processes, so that they could optimize yield. In effect, designers would be working with models of the actual fabricated silicon structures during optimization, rather than with idealized device models. Kahng also said he offered just a small sample of examples from many, if only communication could be established.

Furthermore, an article entitled "A Cost Driven Lithographic Correction Methodology Based on Off the Shelf Sizing Tools" by P. Gupta, A. B. Kahng, D. Sylvester and J. Yang, presented at DAC 2003, Jun. 2-6, 2003, Anaheim, Calif., USA is also incorporated by reference herein in its entirety. This article describes three different levels of OPC (aggressive, medium and none) that can be independently applied to any gate in the design. Synopsys Design Compiler "DC" was used as the synthesis tool. A yield library in which identical cells in the original timing library show up as three "sized" versions with same cell function but different "areas" and "timing" was used as input to the DC. DC was used to perform gate-resizing on a synthesized netlist. This article concludes that it is possible to reduce the cost of OPC while meeting yield and cycle time targets by making OPC aware of slacks and sensitivities in design.

It is well known in the art to transfer a designer's intent in forming certain structures called "dummys" which are commonly used to enhance manufacturability (e.g. to avoid excessive erosion during chemical mechanical polishing as stated in U.S. Pat. No. 6,522,007). Dummys are normally not optical proximity corrected (OPC). Dummys are also not checked during mask inspection (wherein a physical mask generated from geometric data is checked against the electrical design of the circuit). Inadvertent use of dummys in OPC and their use in mask inspection is avoided by placing the dummys on a special layer (also called "reference layer") in GDSII data.

SUMMARY

In accordance with the invention, one or more design-specific attribute(s) of a circuit (such as timing, power, electro-migration, signal integrity) are used to automatically identify one or more regions of one or more layers in a layout of the circuit. The automatically identified regions contain cells and/or features (e.g. that are formed by groups of shapes and/or individual shapes) whose tolerance in silicon (to be fabricated) is to be automatically changed from default. Each design-specific attribute and a sensitivity that is associated thereto (e.g. critical/non-critical or 10% margin) are received prior to the just-described acts, e.g. from a circuit designer.

Shapes that are automatically identified from the design-specific attributes are thereafter identified to one or more manufacturing tools either as overlapping shapes in, or alternatively as existing shapes that have been moved, e.g. to a different layer/datatype pair in GDSII. In an example, geometric information about automatically identified regions may be stored in GDSII format using a conventional datatype (e.g. value 0) with a new layer, or alternatively using a conventional layer (e.g. metal 3) with a new datatype, depending on the embodiment. Each layer/datatype pair, that hold such additional geometric information, conveys a circuit designer's indication of design intent to a manufacturing tool. Hence, design intent is conveyed in a form compatible with an existing interface to the manufacturing tool, as shapes and/or regions. Therefore, manufacturing tools require minimal changes to take into consideration the intent of a circuit designer, when fabricating a wafer.

In some embodiments, a circuit designer expresses each of one or more design intents in the form of (1) a design-specific attribute and (2) its sensitivity such as (a) a limit on or (b) a range for or (c) criticality of, the design-specific attribute. The design-specific attribute and its sensitivity is automatically converted, by one or more analysis tool(s) into geometric information in the form of regions and/or shapes, and manufacturing tools use this geometric information to identify silicon tolerance(s) to be used in manufacturing. More specifically, an analysis tool (such as static timing analysis) is run to report circuit elements (such as net names and/or instance names) that satisfy one or more condition(s) on design-specific attribute(s) (also called "selection conditions") based on design intent. Next, one or more mapping tools (such as a layout-versus-schematic tool and a design rule checker) are run to automatically identify regions or shapes in a circuit's layout that implement the circuit elements reported by the analysis tool(s).

During manufacturing, the manufacturing tools use shapes and/or regions identified by the mapping tools, to automatically change silicon tolerance from default, for example based on a predetermined rule and/or a predetermined correspondence between tolerances and attribute values (e.g. obtained by experimentation). For example, in regions that are automatically selected as described above, one or more silicon tolerances are not relaxed during manufacturing of shapes contained therein, although tolerances are relaxed everywhere else to improve yield and/or cost and/or turn-around-time and/or size of mask data etc. Different levels of (or different kinds of) resolution enhancements may be performed (or not performed) on selected shapes, depending on different levels of aggressiveness at which geometries are to be maintained, which in turn depends on a circuit designer's manual indication of limits and/or ranges and/or criticality of design attributes.

In one example, an analysis tool is programmed to flag one or more circuit elements whose attribute values (such as timing delays) satisfy the above-described selection conditions. The selection conditions contain one or more values for the design-specific attribute, based on its sensitivity indicated in the design intent. A selection condition may require checking, for example, whether the attribute value is within a predetermined range or is above a predetermined limit—such as checking if signals take 80%-90% of allocated time to reach their destinations with a 20%-10% leftover margin or take over 95% of allocated time with 5-0% leftover margin. As another example, if there is a cumulative delay in a single path that spans multiple nets, then if one of the nets is found, by use of analysis tools, to be a larger contributer to an attribute value (such as delay) relative to the other nets, then the circuit designer may choose to set a different selection condition on the larger contributer net (relative to the other nets), thereby to indicate their design intent that different manufacturing tolerances should be applied to the larger contributer net as compared to the other nets.

DETAILED DESCRIPTION

Figure 1:
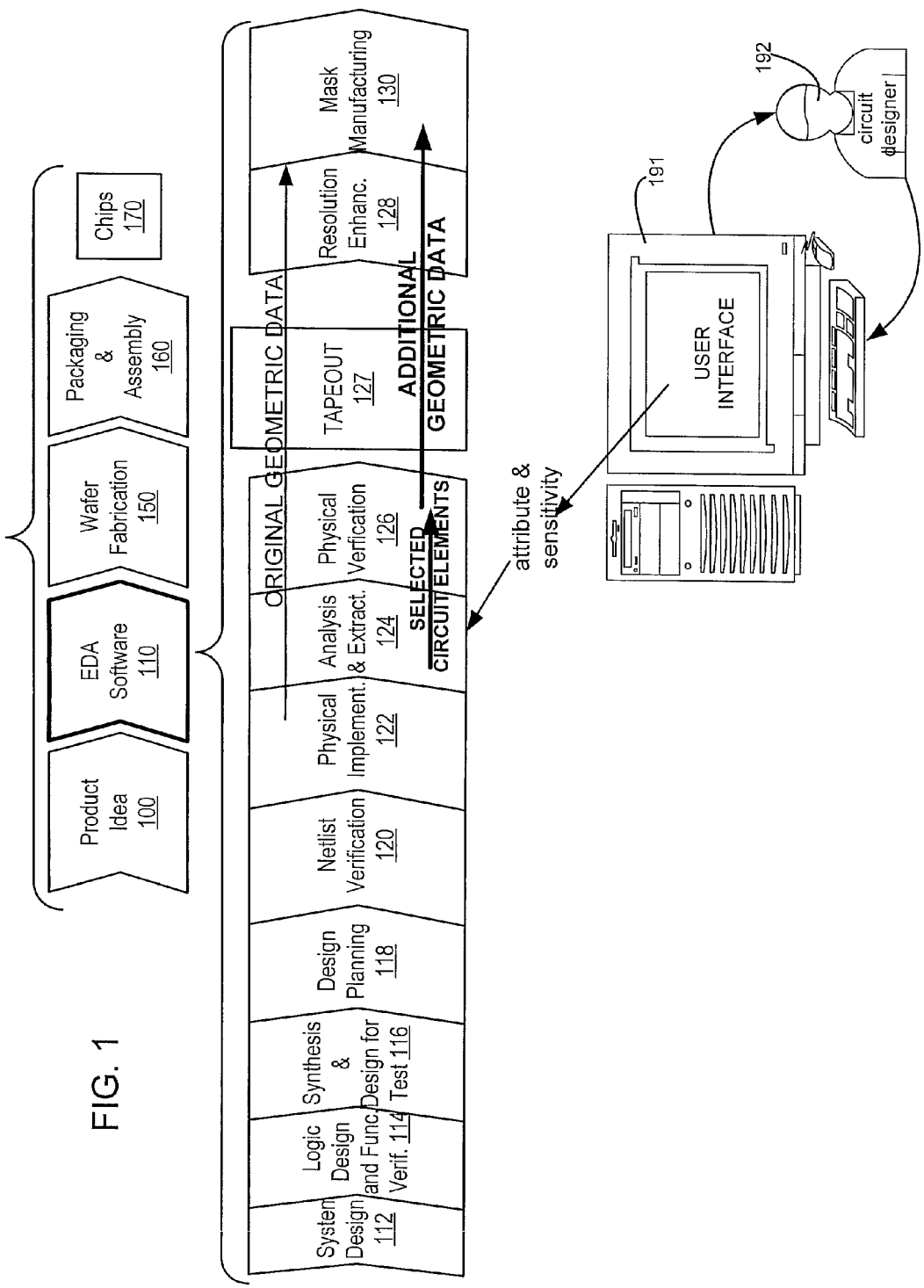
FIG. 1 illustrates a simplified representation of an exemplary high-level digital ASIC design flow that includes a user interface for shape-based design intent in accordance with the invention.

At a high level, a process for creating integrated circuit chips starts with a product idea 100 (FIG. 1) and is realized in a EDA software design process 110. After the EDA software design process, a fabrication stage 150 and packaging and assembly processes 160 occur resulting, ultimately, in finished chips (result 170). EDA software design process 110 is actually composed of a number of stages 112-130, shown in linear fashion for simplicity in FIG. 1. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process 110 is provided below, in the next few paragraphs.

System design (stage 112): One or more circuit designers 192 describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 114): At this stage, the VHDL or Verilog code for modules in the system is written and the design (which may be of mixed clock domains) is checked for functional accuracy. More specifically, does the design as checked to ensure that produces the correct outputs. Exemplary EDA software products from Synopsys, Inc. that can be used at this stage include VCS, VERA, DesignWare®, Magellan, Formality, ESP and LEDA products. Although circuitry and portions thereof (such as flip-flops and gates) are described herein as if they exist in the real world, it is to be understood that at this stage only a computer model of circuitry as described by the circuit designer exists in a programmed computer. The actual circuitry in the real world is created after mask data preparation stage 130 as discussed below.

Synthesis and design for test (stage 116): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 118): Here, an overall floorplan for the chip is constructed and analyzed for timing and top-level routing. Exemplary EDA software products from Synopsys, Inc. that can be used at this stage include Jupiter and Floorplan Compiler products.

Netlist verification (stage 120): At this stage, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 122): The placement (positioning of circuit elements) and routing (connection of the same) occurs at this stage. Exemplary EDA software products from Synopsys, Inc. that can be used at this stage include the Astro product. Note that at this stage geometric data descriptive of shapes becomes available, and this data is provided to the next stage.

Analysis and extraction (stage 124): At this stage, the circuit function is verified at a transistor level, this in turn permits what-if refinement. This stage includes static timing analysis (STA) as well as parametric extraction (e.g. capacitance) tools. Exemplary EDA software products from Synopsys, Inc. that can be used at the at the extraction stage include Star RC/XT, Raphael, and Aurora products followed by tools at the analysis stage which include Prime Time SI.

In this stage 124, the extraction tools extract the resistance, capacitance, and cross-coupling capacitance properties of circuit elements and provide them to the analysis tools. Moreover, the analysis tools in this stage 124 produce data indicative of the effect of circuit elements on various design-specific attributes, such as timing, signal integrity, power, and electro migration. If certain circuit elements do not satisfy a constraint (such as a timing constraint), the designer may re-design certain portions of the circuit to meet the constraint, e.g. in stage 116. Then the above-described stages 118, 120, and 122 are repeated. Reports from this stage, showing the values of design-specific attributes for certain (or all) circuit elements can be displayed to the circuit designer, although such reports identify the circuit elements in an abstract manner (e.g. by name). In some embodiments, data from such reports is provided to the next stage, for use in a graphical display of shapes.

Physical verification (stage 126): At this stage, various checking functions are performed to ensure correctness for: manufacturing, electrical issues, lithographic issues, and circuitry. Exemplary EDA software products from Synopsys, Inc. that can be used at this include the Hercules product. This stage provides functions for checking that shapes satisfy certain design rules and for manipulating (e.g. finding intersection) of shapes in various layers. For this reason, reports from the previous stage are used, in accordance with the invention, map circuit elements that have values of a design-specific attribute in a predetermined range to their respective shapes. For example, all shapes that carry signals with a 10% margin on timing are identified by use of this software, from the selection of circuit elements by the previous stage (analysis tools).

A graphical display of such data may be created by a graphical user interface (GUI) tool called IC Workbench available from Synopsys. The graphical display is provided on a video monitor of a computer 191 at which a designer 192 is working to design the integrated circuit (IC) chip. Designer 192 visually inspects the displayed shapes that require aggressive maintenance of their geometry, e.g. if the designer wants to review a shape in the critical path. Note that silicon tolerance specifications are relaxed during manufacturing, for all shapes other than selected shapes whose geometry is maintained aggressively. Computer 191 provides all selected shapes and an indication (if provided by the designer) of their sensitivity to the design attribute, to the next stage. Note that computer 191 is used to tape out the design in stage 127, when the design is finalized. After this stage, the taped out GDS file is provided to manufacturing as discussed below.

Resolution enhancement (stage 128): This stage is a manufacturing stage which involves geometric manipulations of the layout to improve manufacturability of the design, e.g. by phase shift masking and optical proximity correction. Exemplary EDA software products from Synopsys, Inc. that can be used at this stage include iN-Phase, Proteus, and AFGen products. Note that this stage uses the shapes selection information as obtained by the IC Workbench described above, to change the allowed variation in geometric dimensions (i.e. tolerances) during printing of the wafer. For example, shapes that are not selected have a default resolution enhancement performed thereon.

Mask data preparation (stage 130): This stage is another manufacturing stage which generates final mask data for the mask writer's production of masks for lithographic use to produce finished chips. Exemplary EDA software products from Synopsys, Inc. that can be used at this stage include the CATS(R) family of products. Note that this stage 130 may also use the selected shape information to allow different levels of variations in geometric dimensions (depending on whether or not the shape has been selected), for example to provide different quality levels in fracturing to reduce mask costs. Note that changes in tolerances are also used during mask inspection and wafer inspection (in fabrication stage 150) to avoid false defects being flagged due to the change in tolerance of selected shapes.

Figure 2:
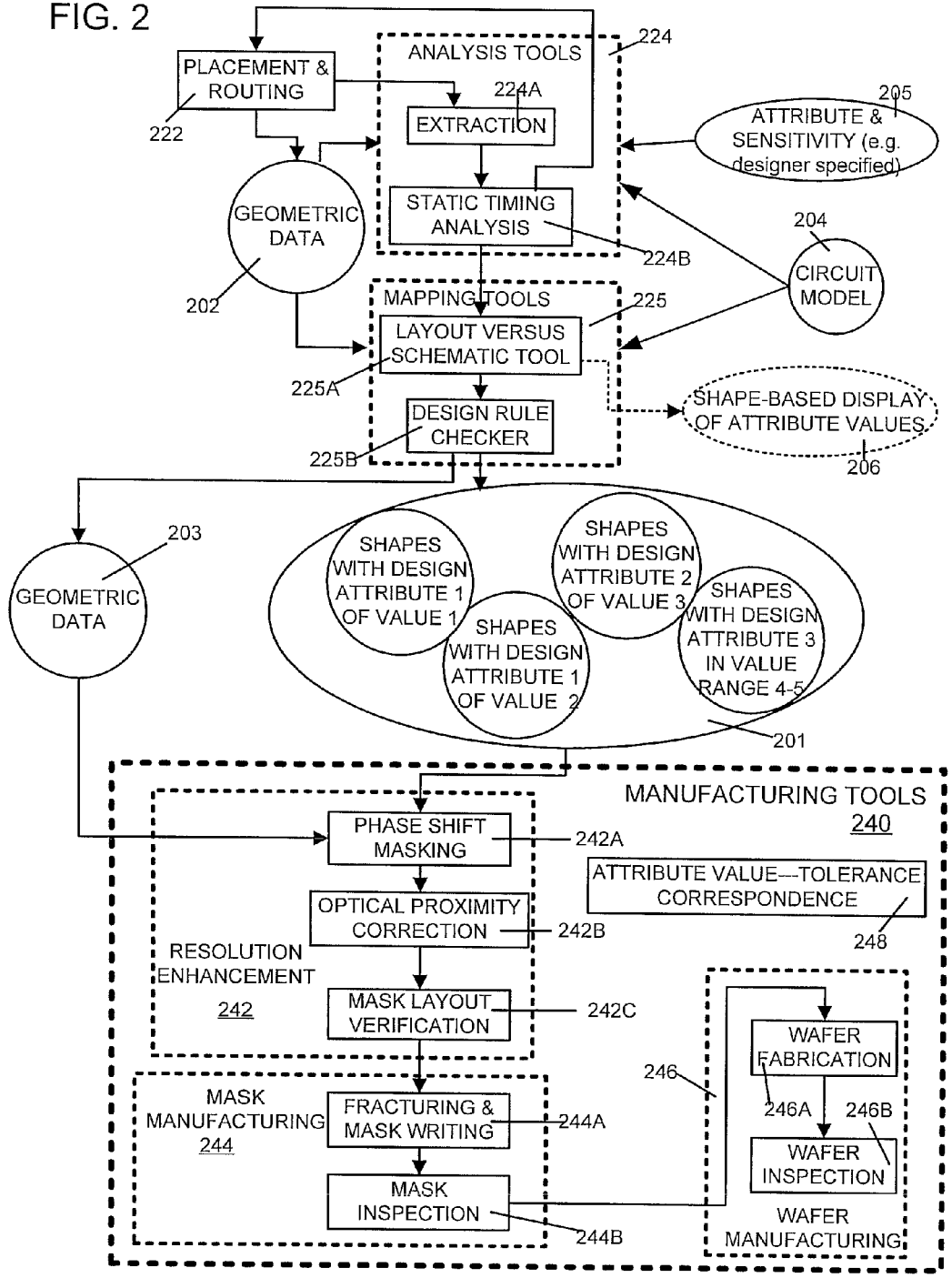
FIG. 2 illustrates, in a detailed design flow, generation of additional geometric data from design intent, for use in manufacturing, e.g. during resolution enhancement, mask manufacturing and wafer manufacturing.

One specific illustrative embodiment shown in FIG. 2 is described next. In this embodiment, tolerances for manufacturing an integrated circuit in silicon are determined by receiving from a designer an indication of sensitivity of nets (which interconnect instances of cells from a library) in a layout to one or more design-specific attributes such as timing. The manually provided information (also called "design intent") is prepared into a selection condition that is applied by an analysis tool 224 to a circuit model.

For example, after timing convergence, one or more reports may be run in static timing analysis tool 224B to identify net names that have a given margin range (e.g. 0%-5% margin) in timing as per the selection condition. As another example, after extraction, one or more reports may be run in extraction tool 224A to identify pairs of net names that have a given margin of cross-coupling capacitance. Therefore, any of a number of design attributes that are supplied by a circuit designer as design intent are processed by one or more of analysis tools 224 to yield names of circuit elements in the IC design. In processing the design intent, analysis tools 224 may use predetermined selection conditions, e.g. a 10% range may be pre-programmed as a default to be used when a designer does not explicitly provide a specific range (e.g. if the designer merely indicates that timing is "critical" without setting a limit of 5% on timing delay).

Note that the names identified by an analysis tool 224, in other embodiments, can be the opposite of the selection condition, e.g. fall outside of the given margin range instead of within the range, so long as the manufacturing tools are appropriately programmed. The net names selected by analysis tools 224 are then mapped to corresponding shapes or regions of a layout of the integrated circuit, as follows. Specifically, the selected net names are supplied to a layout-versus-schematic tool 225A that is used to identify the related shapes, and the results to a design rule checker 225B that is used to identify regions of the layout that contain the selected shapes. The selected regions (or alternatively the selected shapes) are stored in a memory as data 201, along with an indication of sensitivity to the design-specific attribute.

In most embodiments, data 201 is geometric data which is in addition to original geometric data 203 that describes the shapes to be manufactured in silicon and conventionally used by manufacturing tools 240. The selected regions/shapes in additional geometric data 201 (FIG. 2) may be stored either separately from or together with the original geometric data 203. In one specific embodiment, all data is stored together in GDSII format, with original geometric data being stored with datatype value zero and additional geometric data 201 being stored with datatype values other than zero.

The steps of identifying net names based on design intents and mapping of the net names to corresponding shapes or regions of layouts of the integrated circuit may be performed repeatedly for (1) different values of a given design-specific attribute, such as 5% timing, 10% timing, 20% timing etc and/or (2) different design-specific attributes such as timing, electro-migration, signal integrity, power budget, depending on the design intent expressed for this IC design. Note that in some embodiments the acts are repeated for multiple values of each of multiple attributes.

If desired, a circuit designer may view one or more regions and/or shapes of a given layer that contain circuit elements selected by the analysis tool, and may manually change the additional geometric data 201, before its use in manufacturing. Specifically, in an alternative embodiment, a display is provided as follows: a graphical display tool, such as IC Workbench is used to generate a visual display 206 of the shapes identified by the mapping tools 225 as conforming to the given margin (i.e. that carry signals which are 0%-5% fast). Note that the display 206 may contain only such shapes, or alternatively all shapes with the set of shapes in the given margin range highlighted, depending on the embodiment. In the alternative embodiment, the circuit designer may, after reviewing visual display 206, over-write some or all of the information generated by mapping tools 225.

Figure 3A:
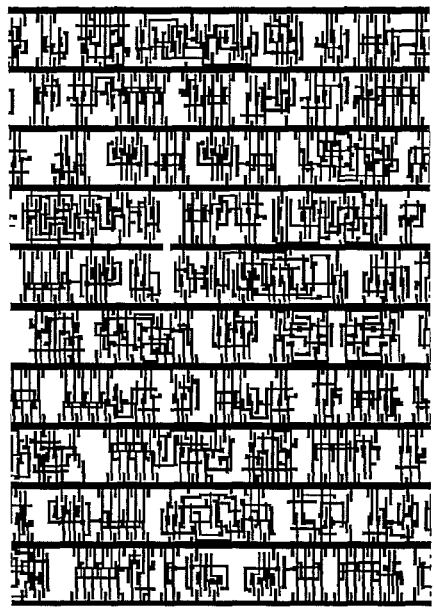
FIG. 3A illustrates a prior art set of shapes to be manufactured in implementing a circuit, illustrated at a high level.
Figure 3B:
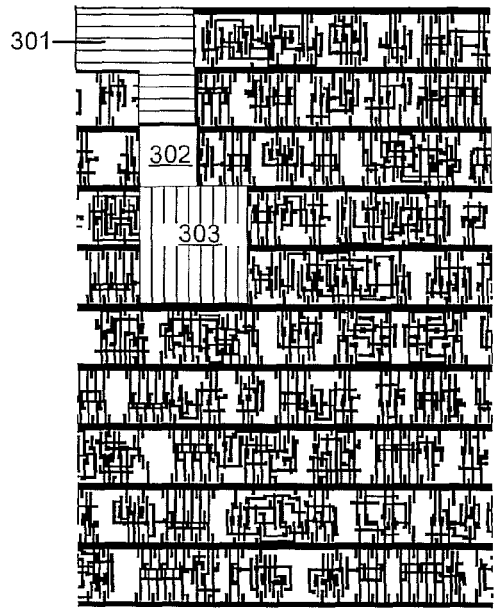
FIG. 3B illustrates, in the set of shapes of FIG. 3A, two regions 301 and 303 that are respectively timing critical and signal integrity critical and a third region 302 that is critical in both attributes, as determined by use of analysis tools and mapping tools in accordance with the invention.
Figure 3C:
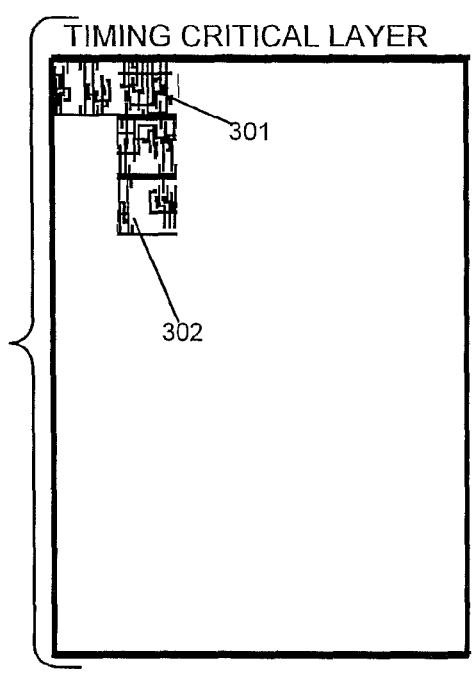
FIGS. 3C and 3D respectively illustrate two additional layers used in some embodiments of the invention to hold the shapes that are timing critical and signal integrity critical respectively.
Figure 4A:
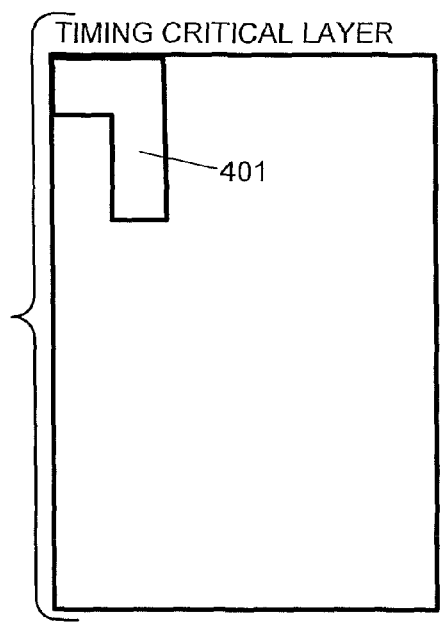
FIGS. 4A and 4B illustrate an alternative embodiment in which the two additional layers identify regions that contain timing critical shapes and signal integrity critical shapes respectively.

In a high-level example of circuit shapes shown in FIG. 3A only certain shapes affect design-attribute values. In this example, regions 301 and 302 (FIG. 3B) are selected by analysis tools 224 as containing shapes which carry the slowest signals, which may be defined as signals that are only 0%-5% fast. If this is a selection condition, as expressed in design intent, then these regions 301 and 302 are automatically identified as being timing critical, and mapping tools 225 are instructed to copy or move these shapes to a new layer (FIG. 3C) that is not conventionally used. Alternatively, the design rule checker 225B or other such mapping tool 225 is instructed to store just the boundaries of regions 301 and 302 in the new layer (see region 401 in FIG. 4A), depending on the embodiment. The new unused layer may be predetermined, e.g. layer number 254 may be reserved for timing critical shapes, which are copied or moved thereto. Note that layer number 254 is provided as an example, and any other layer number may be used. Note that region 401 in the layer of FIG. 4A is used to identify timing critical shapes in numerous layers, such as poly, diffusion, metal 1 and contact.

In the above-described example of the previous paragraph, regions 302 and 303 are found by analysis tools 224 as containing shapes whose signal integrity satisfies a predetermined selection condition (e.g. pairs of shapes having highest cross-coupling capacitance and closest timing delays to one another). Hence, these regions 302 and 303 are selected by analysis tools 224 as being signal integrity critical if this is a selection condition, as expressed in design intent. Therefore, these shapes are copied or moved to another new unused layer (FIG. 3D), e.g. layer number 253. Also, in alternative embodiments, mapping tools 225 are instructed to simply store the boundaries of the regions 302 and 303 in the new layer (e.g. as region 403 in FIG. 4B). Note that in this example, region 403 in FIG. 4B identifies dimensions in only metal 1 layer.

Note that manufacturing tools that receive and process geometric data 203 are modified in accordance with the invention to use additional geometric data 201, as would be apparent to the skilled artisan in view of the disclosure. For example, the manufacturing tools 240 are instructed to obtain the additional data from new layers (e.g. layer numbers 253 and 254) and to interpret the additional data differently depending on whether these layers contain shapes that have been copied or moved or they contain regions to be used with geometric data 203 to identify critical shapes (or in some embodiments non-critical shapes).

Figure 3D:
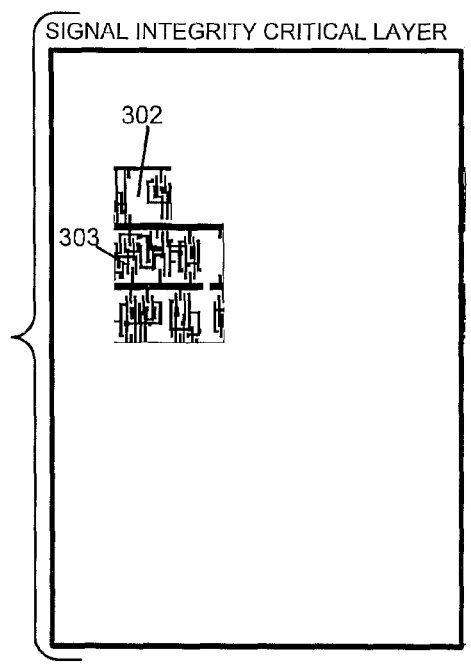
Figure 3E:
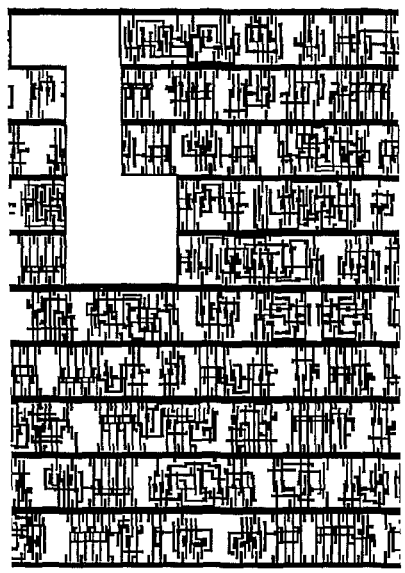
FIG. 3E illustrates non-critical shapes in FIG. 3A which have their tolerance relaxed during manufacturing.
Figure 4B:
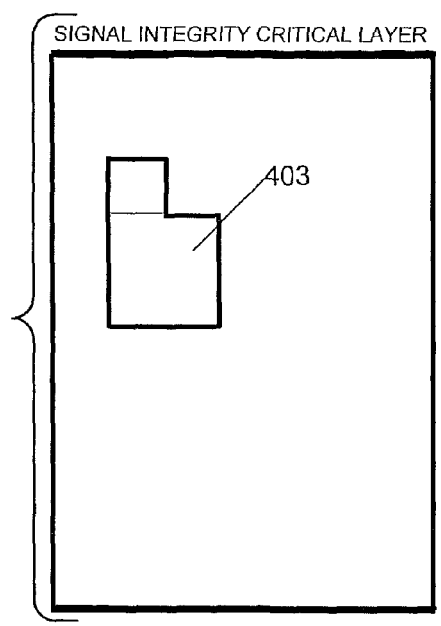

One or more manufacturing tools 240 are also modified to take into account the corresponding design attributes (e.g. timing or signal integrity), and the sensitivity (e.g. 5% sensitive or critical). For example, resolution enhancement tools 242 use smaller tolerances for shapes that are critical (as identified by additional geometric data 203), to over-write default tolerances. Therefore, non-critical shapes (FIG. 3E) remain at default value of tolerance on their critical dimensions. Note that although a single tolerance is shown in FIGS. 3C and 3D for each of the respective attributes, multiple tolerances for each attribute are implemented in some embodiments by use of multiple additional layers, one layer for each of several values of an attribute. For example, two layers in GDSII with layer numbers 253 and 254 may respectively identify shapes that are 5% timing critical and 10% timing critical.

Resolution enhancement tools 242 in some embodiments include phase shift masking tool 242A, optical proximity correction tool 242B and mask layout verification tool 242C. Moreover, manufacturing tools 240 of these embodiments include not only the just-described resolution enhancement tools 242, but also two additional sets of tools, namely mask manufacturing tools 244 and wafer manufacturing tools 246. Mask manufacturing tools 244 in turn include fracturing and mask writing tools 244A and mask inspection tools 244B. Wafer manufacturing tools 246 include wafer fabrication tools 246A and wafer inspection tools 246B. Note that in such embodiments, one or more of the just-described manufacturing tools 240 is modified (and in some embodiments all are modified) to take into account the additional geometric data 201 with or without use of a correspondence 248 (as discussed below).

As noted elsewhere, instead of a new layer being used to hold shapes, a new datatype may be used in alternative embodiments. For example, shapes of metal 1 traces that satisfy a selection condition have their datatype value changed from default value 0, to the new value 1 for timing critical shapes or to new value 2 for signal integrity critical shapes. Such new datatype values (e.g. value 1 for timing critical and value 2 for signal integrity critical) are made known to and used by manufacturing tools 240, to take into account design intent. Some of these alternative embodiments have the advantage of retaining all shapes in their original layers, so that this data can also be used with those manufacturing tools 240 that do not take into account design intent.

Figure 5A:
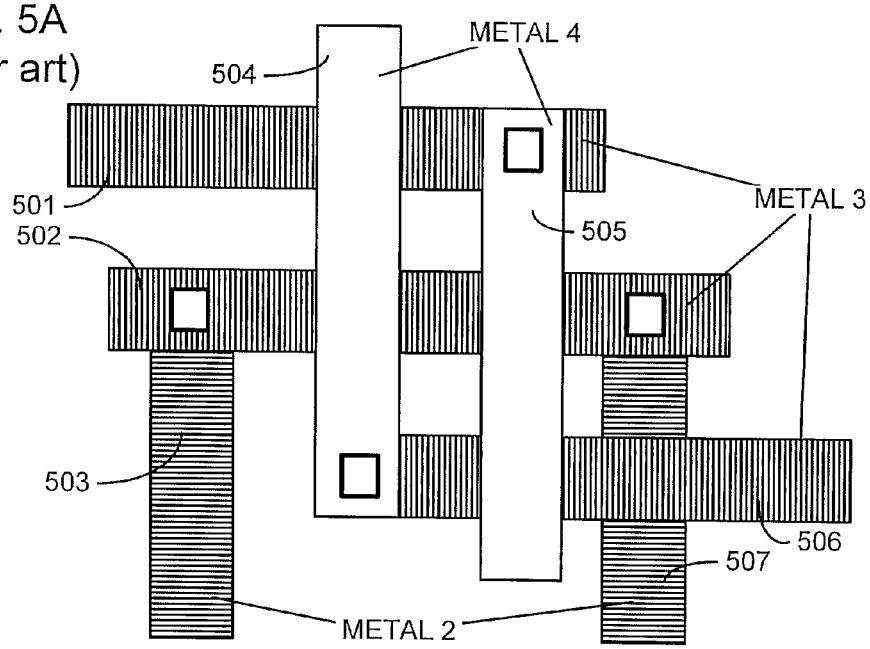
FIGS. 5A and 5B illustrate a prior art set of shapes to be manufactured in implementing a circuit, illustrated at a high level, with FIG. 5A identifying individual metal layers and 5B identifying individual networks.
Figure 5B:
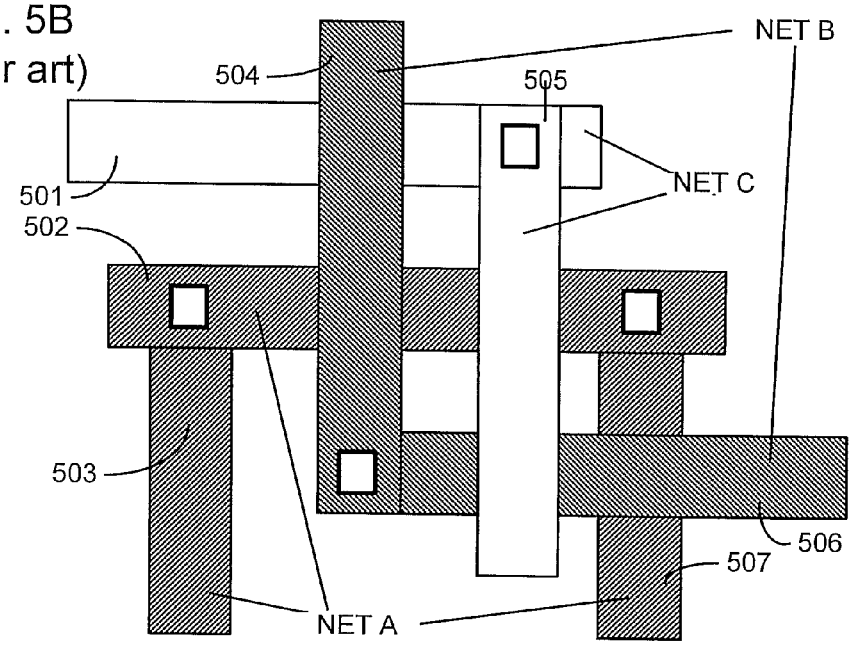
Figure 5C:
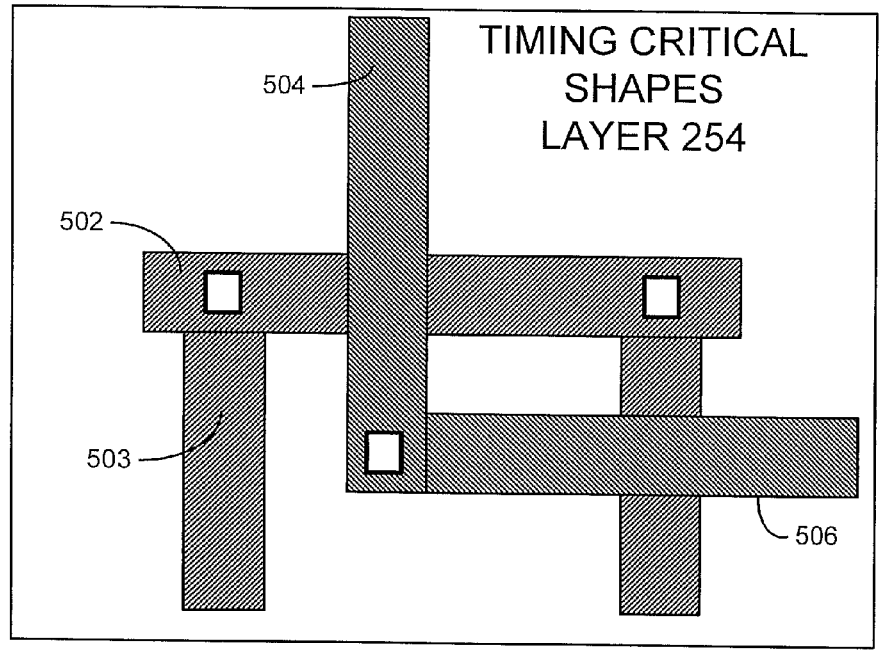
FIGS. 5C and 5D respectively illustrate two additional layers used in some embodiments of the invention to hold the shapes that are timing critical and signal integrity critical respectively.

In a detailed example of circuit shapes shown in FIGS. 5A and 5B, traces 503 and 507 are on metal 2 layer, traces 501, 502 and 506 are on metal 3 layer, and traces 504 and 505 are on metal 4 layer. These same traces are shown in FIG. 5B, with traces 503, 502 and 507 forming net A, traces 504 and 506 forming net B and traces 501 and 505 forming net C. In this example, nets A and B are found to be timing critical by an analysis tool 224 which applies a selection condition, based on design intent supplied by the circuit designer. The net names "A" and "B" are supplied by the analysis tool 224 to a mapping tool 225 which in turn prepares a new layer for timing critical shapes, e.g. shown in FIG. 5C as a single layer of number 254, by copying traces 502, 503, 504, and 506 that form nets A and B to the new layer. Note that in this example, the original geometric data on traces 502, 503, 504, and 506 is not changed, and therefore a manufacturing tool identifies the timing critical shapes in the original geometric data by finding an exact match with shapes in layer 254.

Figure 5D:
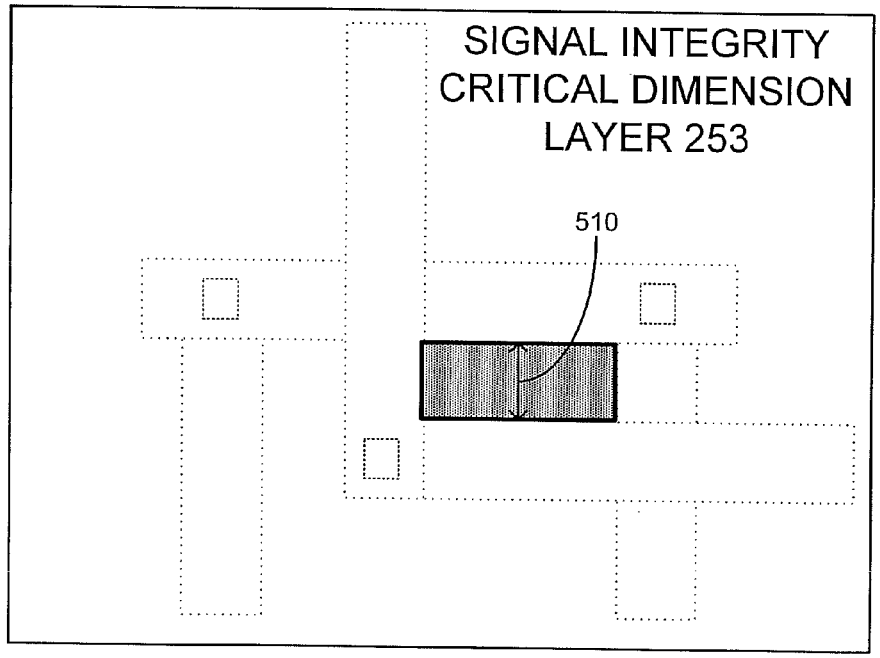

Similarly, in this example, the analysis tool 224 identifies nets "A" and "B" as carrying signals, whose signal integrity is critical, by applying another selection condition, again based on design intent supplied by the circuit designer. A mapping tool 225 then identifies any spaces that are located between these two nets on a common layer, e.g. identifies a dimension 510 (FIG. 5D) in metal 3 layer, between the pair of traces 502 and 506 as requiring geometry to be maintained aggressively during manufacturing. This dimension 510 is added by mapping tool 225, to a new layer (e.g. layer number 253 in FIG. 5D) to be used to identify signal integrity critical shapes. Note that in FIG. 5D, the traces of nets A and B are shown dofted, to indicate their spatial relationship relative to the critical dimension 510, and it is to be understood that the just-described new layer, for signal integrity shapes, does not contain these traces. Note that the word "dimension" is used generically herein to refer to not only dimensions between traces but also to refer to dimensions of traces.

Figure 6A:
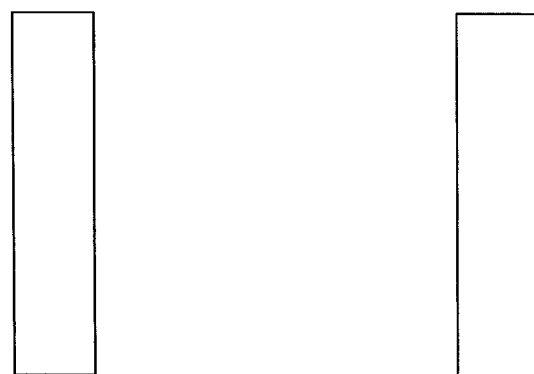
FIGS. 6A-6C illustrate an alternative embodiment in which three layers one for each metal layer in the original geometric data are used to hold regions that identify timing critical shapes in the respective metal layers.
Figure 6B:
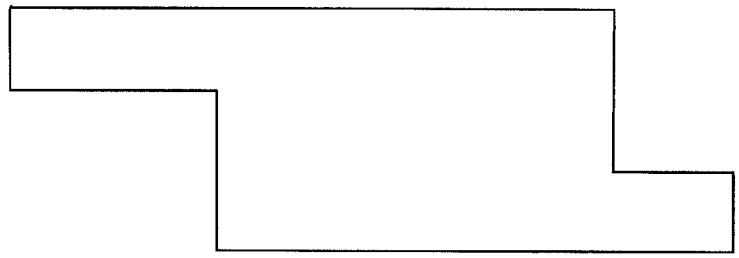
Figure 6C:
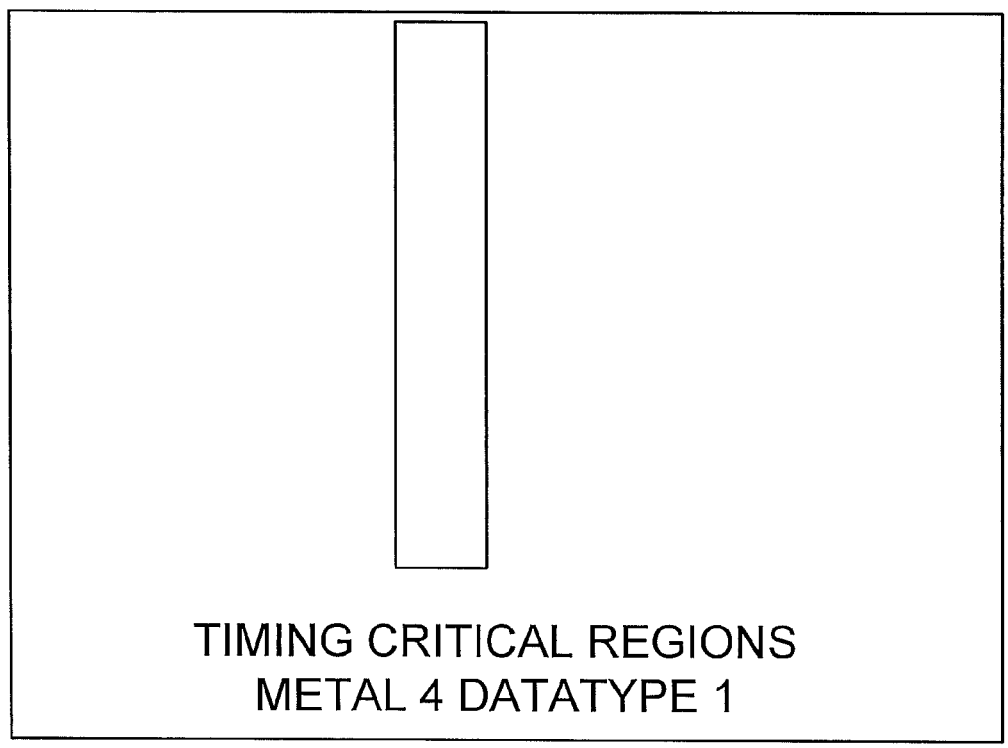

As noted above, manufacturing tools 240 know and use the specific format in which the additional geometric data 201 is supplied by mapping tools 225. For example, if shapes and/or regions are being supplied in additional layers with the original geometric data 203 intact, then manufacturing tools 240 identify the critical shapes by finding overlaps therebetween. Specifically, intersections (or overlaps) between additional geometric data 201 and original geometric data 203 are found, and the intersections are made regardless of layers. Therefore, a region that is identified as timing critical in layer number 254 may identify shapes that intersect therewith and that are located in any one or more of several layers. In the example of FIGS. 5A and 5B, metal 2, metal 3 and metal 4 shapes are overlapped by the regions shown in FIGS. 6A, 6B and 6C respectively.

Manufacturing tools 240 associate critical shapes (found from such intersections) with predetermined tolerances that are smaller or bigger than default tolerances. The predetermined tolerances are set from prior experience or from experimental data, e.g. if silicon fabricated to these tolerances is known to conform to corresponding constraints on the design-specific attribute values (e.g. timing delays). In many embodiments, a correspondence 248 between a number of values of a design-specific attribute and tolerances needed to achieve them is prepared ahead of time, for use in manufacturing tools 240. Such a correspondence 248 may take the form of a set of rules as discussed in the next paragraph.

Figure 3F:
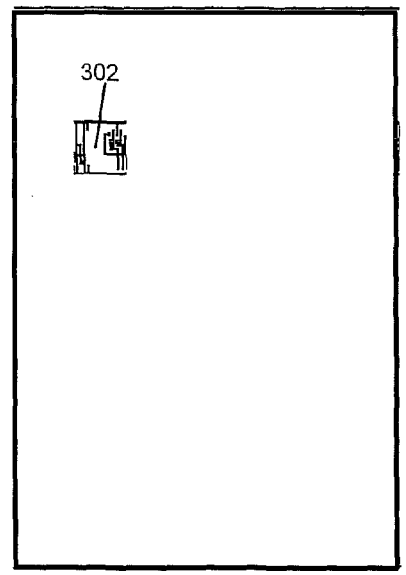
FIG. 3F illustrates certain shapes in FIG. 3A which have their tolerance maintained most aggressively during manufacture, due to these shapes being both timing critical and signal integrity critical.

When certain shapes satisfy multiple conditions (e.g. if a shape is both timing critical and signal integrity critical) as illustrated by region 302 (FIG. 3F), then certain tolerances are calculated by programming the manufacturing tools to apply a predetermined rule that may be one of the rules in the set discussed in the previous paragraph.

An example of such a set is as follows:
 if a space is timing critical, use tolerance of 0.10 nm
 if a space is signal integrity critical, use tolerance of 0.09 nm
 if a space is both timing critical and also signal integrity critical, use tolerance of 0.08 nm The last rule in the above set identifies the smallest tolerance among the three rules, i.e. tolerance to be applied when both attributes are critical is smaller than the tolerance applied when only one of the attributes is critical.

In some embodiments, resolution enhancement tools 242 are programmed to process a shape that satisfies multiple conditions (e.g. as identified in multiple additional layers) by handling different portions of the shape differently, e.g. aggressively maintain geometry of a critical edge of a trace (if it is adjacent to another trace) to ensure signal integrity, while allowing an opposite edge of the trace to have relaxed tolerance, if the opposite edge is non-critical. Applying different tolerances to different edges of a single trace can improve timing and/or reduce mask costs (e.g. by simplifying a complex shaped but non-critical edge into a straight line).

Note that a manufacturing tolerance may be relaxed by any manufacturing tool 240, such as a mask manufacturing tool 244 and/or a wafer manufacturing tool 246, instead of or in addition to tolerance relaxation by a resolution enhancement 242. Specifically, the silicon tolerance may be changed to permit a process change (e.g. 2-4 process points) from an ideal process, which is defined as stepper at zero defocus and perfect control in the amount of energy. Having a bigger tolerance allows a silicon feature being fabricated to deviate e.g. print a little bigger—if there is enough tolerance. So resolution enhancement tools 242 can either over-size a feature or shift the feature or alternatively permit manufacturing to make the IC design more tolerant of deviations in a wafer fabrication process (i.e. without having to frequently correct for process drifts).

Note that in many embodiments of the type described herein, the analysis tools 224 don't specify exact manufacturing tolerances on the selected shapes and instead they simply mark certain shapes and/or regions as being timing critical, and manufacturing tools 240 know what tolerances to apply from a predetermined correspondence between tolerance changes and attribute value changes (determined from experimentation). For example, mask writers may define certain manufacturing tolerance values and investigate their impact as follows in two (or more) steps. In one step, shapes in an exemplary IC design are changed to correspond to a worst case manufacturing tolerance (e.g. 10% increase in width of a trace), and then analysis tools 224 are invoked on these changed shapes to investigate the impact of these worst case tolerances on circuit attributes. The resulting attribute values (e.g. 10% increase in signal delay) are used to define one predetermined correspondence between these attribute values and tolerances. This step is then repeated with a best case manufacturing tolerance, to obtain another predetermined correspondence. In this manner any number of correspondences may be obtained, simply by changing the manufacturing tolerance and investigating its impact on circuit attributes with analysis tools 224. A range of attribute values that a circuit designer is likely to use may be covered by such experimentation.

The data structures and software code for implementing one or more acts described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In one embodiment, the carrier wave includes computer instruction signals for carrying out the process of FIG. 2.

Numerous modifications and adaptations of the embodiments described herein will become apparent to the skilled artisan in view of this disclosure. Although in some embodiments, the original geometric data 203 and the additional geometric data 201 are transferred in the same format, namely as geometric data (e.g. both GDSII), in other embodiments the additional geometric data 201 is supplied in a file that is separate from and in a format that is different from the original geometric data 203.

For example, some embodiments may identify all nets that fit a selection condition on one attribute (e.g. within 90% or less timing delay meaning these signals are fast and there is at least 10% time available for them to be delayed), then change that circuit attribute's value for the identified nets assuming that the corresponding manufacturing tolerance has been changed (e.g. slow down the signals on these nets by 10% assuming that manufacturing tolerances are relaxed and the traces are printed wider). Then these embodiments repeat the just-described acts on the changed design to now find nets that fit a selection condition on another attribute such as signal integrity. The geometric data of such nets is then marked (in design intent) as being signal integrity critical. Note that the just described process is repeated to find nets that are timing critical again. Hence, the IC design may be changed in an iterative loop by optimizing one or more design attributes during each iteration e.g. until convergence is reached.

Moreover, although certain examples and scenarios have been described herein, their inverse examples and scenarios will be apparent to the skilled artisan in view of this disclosure. Specifically, if a selection condition is used to identify fast nets whose manufacturing tolerances are to be relaxed (i.e. identify in additional geometric data that these fast nets are timing non-critical), then the inverse example is for the selection condition to identify slow nets whose manufacturing tolerances are to be maintained aggressively (i.e. identify these slow nets as being timing critical).

Numerous modifications and adaptations of the embodiments described herein are encompassed by the scope of the invention.

The invention claimed is:

1. A computer-implemented method of generating information related to manufacturing an integrated circuit (IC) in silicon, the method comprising:
   receiving, by a computer, a selection condition comprising a design-specific circuit attribute value for an IC represented as a circuit model;
   identifying, by applying an analysis tool to the circuit model, one or more nets from the circuit model, the one or more nets having the design-specific circuit attribute in conformance with the selection condition;
   identifying a plurality of shapes in a layout of the circuit model corresponding to the one or more nets, the layout comprising geometric data describing shapes obtained from the circuit model; and
   performing resolution enhancement on the layout by using a first silicon tolerance for a shape from the plurality of shapes and using a second silicon tolerance for a shape outside the plurality of shapes.

2. The computer-implemented method of claim 1 wherein:
   geometric data describing the plurality of shapes is stored in a layer of a data file reserved for the design-specific circuit attribute.

3. The computer-implemented method of claim 2 wherein:
   geometric data describing the plurality of shapes is additionally stored in at least one other layer of the data file different from the layer reserved for the design-specific circuit attribute.

4. The computer-implemented method of claim 1 wherein:
   geometric data describing the plurality of shapes is stored in a datatype in a data file reserved for the design-specific circuit attribute.

5. The computer-implemented method of claim 1 further comprising:
   storing in a storage device, geometric data related to a region that overlaps the plurality of shapes.

6. The computer-implemented method of claim 1 wherein:
   the selection condition is to identify pairs of shapes having highest cross-coupling capacitance and closest timing delays relative to one another.

7. The computer-implemented method of claim 1 wherein:
   the selection condition requires comparing time taken by signals to reach their destination with a first percentage range of allocated time.

8. The computer-implemented method of claim 1 wherein, the analysis tool is a static timing analysis tool.

9. The computer-implemented method of claim 1 wherein, the selection condition comprises a range for the design-specific circuit attribute.

10. The computer-implemented method of claim 1 wherein, the selection condition comprises a limit on the design-specific circuit attribute.

11. The computer-implemented method of claim 1 wherein, the selection condition specifies criticality of the design-specific circuit attribute.

12. A computer comprising a processor and a memory coupled to the processor, the memory comprising instructions to generate information related to manufacturing an integrated circuit (IC) in silicon, wherein the memory comprises:
   instructions to receive a selection condition comprising a design-specific circuit attribute value for an IC represented as a circuit model;
   instructions to identify by applying an analysis tool to the circuit model, one or more nets from the circuit model, the one or more nets having the design-specific circuit attribute in conformance with the selection condition;

instructions to identify a plurality of shapes in a layout of the circuit model corresponding to the one or more nets, the layout comprising geometric data describing shapes obtained from the circuit model; and instructions to store information describing the plurality of shapes, the information for performing resolution enhancement on the layout using a first silicon tolerance for a shape from the plurality of shapes and using a second silicon tolerance for a shape outside the plurality of shapes.

13. The computer of claim 12 wherein:
geometric data describing the plurality of shapes is stored in a taped out file, in a layer reserved for the design-specific circuit attribute.

14. The computer of claim 12 wherein:
geometric data describing the plurality of shapes is stored in a file separate from a taped out file storing information describing the layout.

15. The computer of claim 12 wherein:
the selection condition requires comparing time taken by signals in the circuit model to reach their destination with a first percentage range of allocated time.

16. The computer of claim 12 wherein:
the selection condition is to identify pairs of shapes having highest cross-coupling capacitance and closest timing delays relative to one another.

17. An apparatus for generating information related to manufacturing of an integrated circuit (IC) in silicon, the apparatus comprising:
a computer comprising a non-transitory computer-readable storage medium storing instructions, when executed by the computer, causing the computer to:
receive a selection condition comprising a design-specific circuit attribute value for an IC represented as a circuit model;
identify by applying an analysis tool to the circuit model, one or more nets from the circuit model, the one or more nets having the design-specific circuit attribute in conformance with the selection condition;
identify a plurality of shapes in a layout of the circuit model corresponding to the one or more nets, the layout comprising geometric data describing shapes obtained from the circuit model; and
a manufacturing tool configured to:
receive information describing the plurality of shapes and performing resolution enhancement on the layout by using a first silicon tolerance for a shape from the plurality of shapes and using a second silicon tolerance for a shape outside the plurality of shapes.

18. The apparatus of claim 17 wherein:
geometric data describing the plurality of shapes is stored in a taped out file, in a layer reserved for the design-specific circuit attribute.

19. A computer-implemented method of generating information related to manufacturing an integrated circuit (IC) in silicon, the method comprising:
a manufacturing tool receiving a layout of a circuit model of the IC, and information describing a plurality of shapes, the plurality of shapes determined by an analysis tool, the determining comprising:
receiving a selection condition comprising a design-specific circuit attribute value for the IC;
identifying, by analysis tool to the circuit model, one or more nets from the circuit model, the one or more nets having the design-specific circuit attribute in conformance with the selection condition;
identifying the plurality of shapes in the layout of the circuit model corresponding to the one or more nets, the layout comprising geometric data describing shapes obtained from the circuit model; and
the manufacturing tool using a first silicon tolerance for a shape from the plurality of shapes and using a second silicon tolerance for a shape outside the plurality of shapes during manufacture of the shape in the layout.

20. The computer-implemented method of claim 19 further comprising:
the manufacturing tool performing resolution enhancement on the layout.

* * * * *